(12) United States Patent
Chang et al.

(10) Patent No.: US 9,570,520 B2
(45) Date of Patent: Feb. 14, 2017

(54) LIGHT EMITTING DEVICE

(71) Applicant: SAMSUNG DISPLAY CO., LTD., Yongin, Gyeonggi-Do (KR)

(72) Inventors: Seung Wook Chang, Suwon-si (KR); Young Hee Lee, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/719,395

(22) Filed: May 22, 2015

(65) Prior Publication Data

US 2016/0163926 A1 Jun. 9, 2016

(30) Foreign Application Priority Data

Dec. 5, 2014 (KR) .................. 10-2014-0173909

(51) Int. Cl.
*H01L 29/20* (2006.01)
*H01L 33/00* (2010.01)
*H01L 27/32* (2006.01)
*H01L 51/50* (2006.01)
*H01L 51/52* (2006.01)

(52) U.S. Cl.
CPC ......... *H01L 27/3211* (2013.01); *H01L 51/50* (2013.01); *H01L 51/5084* (2013.01); *H01L 51/5265* (2013.01)

(58) Field of Classification Search
CPC ................................................ H01L 27/2306
USPC ........................................................ 257/89
See application file for complete search history.

(56) References Cited

U.S. PATENT DOCUMENTS

| 7,663,140 | B2 | 2/2010 | Yamazaki et al. | |
|---|---|---|---|---|
| 8,878,171 | B2 | 11/2014 | Heo et al. | |
| 2009/0026921 | A1* | 1/2009 | Kuma | H01L 51/5265 313/504 |
| 2013/0320308 | A1* | 12/2013 | Lee | H01L 51/52 257/40 |
| 2014/0117315 | A1* | 5/2014 | Kim | H01L 51/0001 257/40 |
| 2014/0138655 | A1* | 5/2014 | Sonoyama | H01L 51/0005 257/40 |

(Continued)

FOREIGN PATENT DOCUMENTS

| JP | 2012-054225 A | 3/2012 |
|---|---|---|
| KR | 2006-0108332 A | 10/2006 |

(Continued)

*Primary Examiner* — Matthew Landau
*Assistant Examiner* — Igwe U Anya
(74) *Attorney, Agent, or Firm* — Lee & Morse, P.C.

(57) ABSTRACT

A light emitting device, including a first electrode; a hole transport area on the first electrode; a first light emitting layer on the hole transport area, the first light emitting layer emitting a first color, and having a first thickness; a second light emitting layer adjacent to one side of the first light emitting layer, the second light emitting layer emitting a second color, and having a second thickness; a first shadow layer on the first light emitting layer, the first shadow layer including a same material as the second light emitting layer, and first shadow layer having a thickness corresponding to about 1% of the second thickness; an electron transport area on the first light emitting layer, the second light emitting layer, and the first shadow layer; and a second electrode on the hole transport area.

20 Claims, 4 Drawing Sheets

(56) References Cited

U.S. PATENT DOCUMENTS

| 2014/0145163 A1* | 5/2014 | Lee | ................... | H01L 27/3211 |
| | | | | 257/40 |
| 2014/0151658 A1* | 6/2014 | Lee | ................... | H01L 51/5012 |
| | | | | 257/40 |
| 2015/0194613 A1* | 7/2015 | Sakuma | ................ | C09K 11/06 |
| | | | | 257/40 |

FOREIGN PATENT DOCUMENTS

| KR | 10-2008-0083449 A | 9/2008 |
| KR | 10-2014-0070168 A | 6/2014 |

\* cited by examiner

ЛIGHT EMITTING DEVICE

CROSS-REFERENCE TO RELATED APPLICATION

Korean Patent Application No. 10-2014-0173909, filed on Dec. 5, 2014, in the Korean Intellectual Property Office, and entitled: "Light Emitting Device," is incorporated by reference herein in its entirety.

BACKGROUND

1. Field

The present disclosure herein relates to a light emitting device.

2. Description of the Related Art

A light emitting device may be composed of a light emitting layer inserted between a pair of opposite electrodes. The light emitting device may use a phenomenon that, when an electric field is applied between both electrodes, electrons are injected from a second electrode and holes are injected from a first electrode, and the electrons and the holes recombine in the light emitting layer to emit light by virtue of energy generated while a recombination energy level returns from a conduction band to a valence band.

SUMMARY

Embodiments may be realized by providing a light emitting device, including a first electrode; a hole transport area on the first electrode; a first light emitting layer on the hole transport area, the first light emitting layer emitting a first color, and having a first thickness; a second light emitting layer adjacent to one side of the first light emitting layer, the second light emitting layer emitting a second color, and having a second thickness; a first shadow layer on the first light emitting layer, the first shadow layer including a same material as the second light emitting layer, and first shadow layer having a thickness corresponding to about 1% of the second thickness; an electron transport area on the first light emitting layer, the second light emitting layer, and the first shadow layer; and a second electrode on the hole transport area.

The device may further include a second shadow layer between the hole transport area and the second light emitting layer, the second shadow layer including a same material as the first light emitting layer, and having a thickness corresponding to about 1% of the first thickness.

The first and second colors may be selected from blue, green, and red.

The first color may be blue, and the second color may be green.

The device may further include a third light emitting layer adjacent to a side of the first light emitting layer opposite of the side of the first light emitting layer adjacent to the second light emitting layer, the third light emitting layer emitting a third color, and the third light emitting layer having a third thickness; and a second shadow layer on the first shadow layer and the second light emitting layer, and the second shadow layer having a thickness corresponding to about 1% of the third thickness.

A total thickness of the first and second shadow layers may be about 10 Å or less.

The device may further include a third shadow layer between the hole transport area and the third light emitting layer, the third shadow layer including a same material as the first light emitting layer, and the third shadow layer having a thickness corresponding to about 1% of the first thickness; and a fourth shadow layer between the third shadow layer and the third light emitting layer, the fourth shadow layer including the same material as the second light emitting layer, and the fourth shadow layer having a thickness corresponding to about 1% of the second thickness.

A total thickness of the third and fourth shadow layers may be about 10 Å or less.

The device may further include a fifth shadow layer between the hole transport area and the second light emitting layer, the fifth shadow layer including the same material as the first light emitting layer, the fifth shadow layer and having a thickness corresponding to about 1% of the first thickness.

The first, second, and third colors may be selected from blue, green, and red.

The first color may be blue, the second color may be green, and the third color may be red.

The hole transport layer may include a hole transport layer, the hole transport area including a first hole transport material layer adjacent to the first electrode; a second hole transport material layer adjacent to the first and second light emitting layers; and an electron transport material layer between the first and second hole transport material layers, and the electron transport material layer including a same material as the electron transport area.

The electron transport material layer may include lithium quinolate (HQ).

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
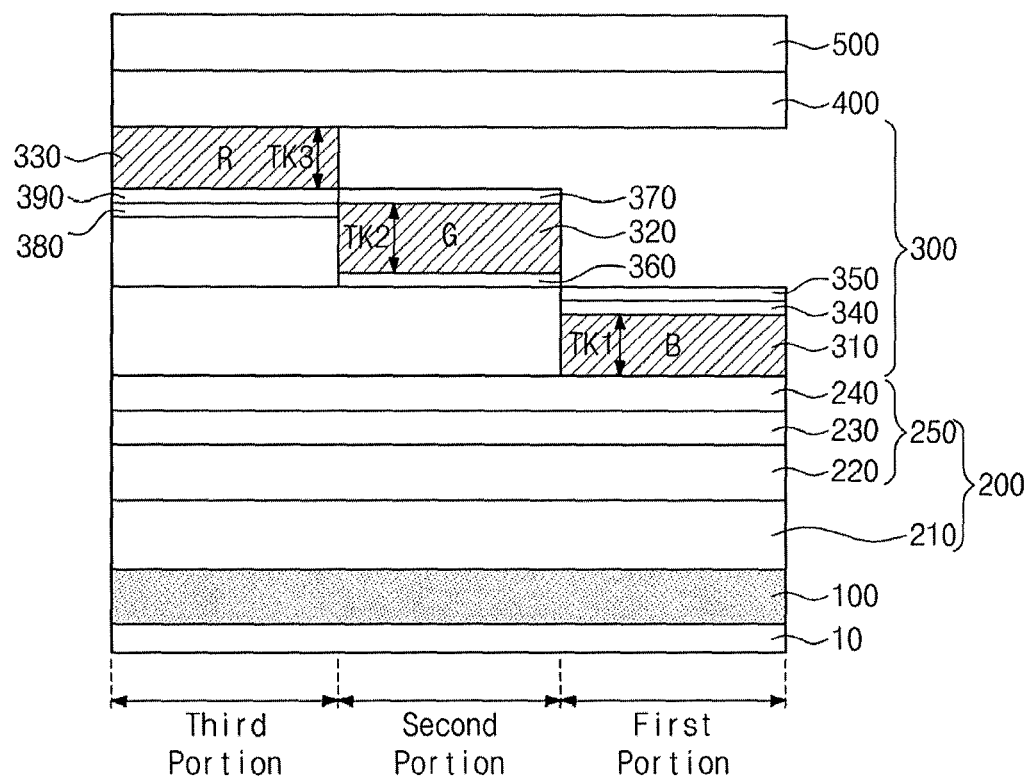
FIG. 1 illustrates a cross-sectional view of a light emitting device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the specification, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The embodiment in the detailed description will be described with cross-sectional views and/or plan views as ideal exemplary views. In the figures, the dimensions of layers and areas may be exaggerated for clarity of illustration. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. For example, an etched area illustrated as having a right angle may have rounded or curved features. Areas exemplified in the drawings have general properties, and are used to illustrate a specific shape of a semiconductor package area. Thus, this should not be construed as limiting. Also, though terms of "first", "second", and "third" are used to describe various areas and layers in various embodiments, the areas and the layers are not limited to these terms. These terms are only used to distinguish one component from another component. Embodiments described and exemplified herein include complementary embodiments thereof.

In the following description, the technical terms are used only for explaining a specific exemplary embodiment while not intended to be limiting. The terms of a singular form may also include plural forms unless specifically mentioned. The terms "comprises" and/or "comprising" used herein is not intended to exclude other components besides a mentioned component.

FIG. 1 illustrates a cross-sectional view of a light emitting device according to an embodiment.

Referring to FIG. 1, the light emitting device may include a substrate 10; and a first electrode 100, a hole transport area 200, a light emitting structure 300, an electron transport area 400, and a second electrode 500, which are sequentially stacked on the substrate 10.

The substrate 10 may be formed of, for example, glass, transparent plastics, or quartz.

The first electrode 100 may be a pixel electrode or an anode. The first electrode 100 may be a transmissive electrode, a transflective electrode, or a reflective electrode. When the first electrode 100 is a transmissive electrode, the first electrode 100 may be formed of a transparent metal oxide, for example, indium tin oxide (ITO), indium zinc oxide (IZO), zinc oxide (ZnO), or indium tin zinc oxide (ITZO). When the first electrode 100 is a transflective electrode or a reflective electrode, the first electrode 100 may be formed of Ag, Mg, Al, Pt, Pd, Au, Ni, Nd, Ir, Cr, or a mixture of metals.

The first electrode 100 may have a single layer structure formed of a transparent metal oxide or a metal, or may have a multilayer structure which has a plurality of layers. For example, the first electrode 100 may have a single layer structure formed of ITO, Ag, or a metallic mixture (for example, a mixture of Ag and Mg), a double layer structure of ITO/Mg or ITO/MgF, or a triple layer structure of ITO/Ag/ITO.

The hole transport area 200 may include a hole transport layer 250. According to an embodiment, the hole transport layer 250 may have a multilayer structure. According to an embodiment, the hole transport layer 250 may have a structure in which a first hole transport material layer 220, an electron transport material layer 230, and a second hole transport material layer 240 are stacked in sequence.

The hole transport area 200 may be formed by using various methods, such as a vacuum deposition method, a spin coating method, a casting method, a Langmuir-Blodgett (LB) method, an inkjet printing method, a laser printing method, and a laser induced thermal imaging (LITI) method.

Each of the first and second hole transport material layers 220 and 240 may include, for example, a carbazole-based derivative, such as N-phenylcarbazole and polyvinylcarbazole, a fluorine-based derivative, a triphenylamine-based derivative, such as N,N'-bis(3-methylphenyl)-N,N'-diphenyl-[1,1-biphenyl]-4,4'-diamine (TPD), and 4,4',4''-tris(N-carbazolyl)triphenylamine (TCTA), N,N-di(1-naphthyl)-N,N-diphenylbenzidine (NPB), or 4,4'-cyclohexylidene bis[N,N-bis(4-methylphenyl)benzenamine] (TAPC).

The electron transport material layer 230 may have a hole blocking property and may adjust a density of holes moving from the first electrode 100 to the light emitting structure 300, and the electron transport material layer 230 may serve to properly maintain a balance of electric charges introduced into the light emitting structure 300. For example, the electron transport material layer 230 may include a substantially same material as the electron transport layer. For example, the electron transport material layer 230 may include lithium quinolate (LiQ), tris(8-hydroxyquinolinato) aluminum (Alq3), 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di (naphthalene-2-yl)anthracene (ADN), or a mixture thereof.

According to an embodiment, the first hole transport material layer 220 may be disposed on the first electrode 100 while having a predetermined thickness. The electron transport material layer 230 may be disposed on the first hole transport material layer 220 while having a much thinner thickness than the first hole transport material layer 220. The second hole transport material layer 240 may be disposed on the electron transport material layer 230 while having a different thickness according to a color of the light emitting layer of the light emitting structure 300 which may be disposed on the second hole transport material layer 240. For example, the thickness of the second hole transport material layer 240 may become gradually thicker from a blue color ("B") light emitting layer, to a green color ("G") light emitting layer, and to a red color ("R") light emitting layer. By adjusting the thickness of the second hole transport material layer 240, the thickness of the hole transport layer 250 may be adjusted and emitted light may be constructively interfered, and a vertical direction efficiency may be optimized in the blue color, green color, and red color light emitting layers.

According to an embodiment, the hole transport area 200 may have a single layer structure formed of a single material, a single layer structure formed of a plurality of materials different from each other, or a multilayer structure including a plurality of layers formed of a plurality of materials different from each other. For example, the hole transport area 200 may have a structure formed of a single layer including a plurality of materials different from each other, or may have a multilayer structure in which a hole injection layer 210/a hole transport layer 250, a hole injection layer 210/a hole transport layer 250/a buffer layer (not shown), a hole injection layer 210/a buffer layer, a hole transport layer 250/a buffer layer, or a hole injection layer 210/a hole transport layer 250/an electron blocking layer (not shown) are sequentially stacked from the first electrode 100.

When the hole transport area 200 includes the hole injection layer 210, the hole transport area 200 may include, for example, a phthalocyanine compound, such as copper phthalocyanine; N,N'-diphenyl-N,N'-bis-[4-(phenyl-m-tolyl-amino)-phenyl]-biphenyl-4,4'-diamine (DNTPD); 4,4',4"-tris(3-methyl phenyl amino)triphenylamine (m-MTDATA); 4,4',4"-tris(N,N-diphenylamino)triphenylamine (TDATA); 4,4',4"-tris{N,-(2-naphthyl)-N-phenylamino}-triphenylamine (2TNATA); poly(3,4-ethylenedioxythiophene)/poly(4-styrenesulfonate) (PEDOT/PSS); polyaniline/dodecylbenzenesulfonic acid (PANI/DBSA); polyaniline/camphor sulfonicacid (PANI/CSA); or (polyaniline)/poly(4-styrenesulfonate) (PANI/PSS).

The thickness of the hole transport area 200 may be about 100 to about 10000 Å, for example, about 100 to about 1000 Å. When the hole transport area 200 includes both of the hole injection layer 210 and the hole transport layer 250, the thickness of the hole injection layer 210 may be about 100 to about 10,000 Å, for example, about 100 to about 1,000 Å, and the thickness of the hole transport layer 250 may be about 50 to about 2,000 Å, for example, about 100 to about 1,500 Å. Maintaining the thickness of the hole transport area 200, the hole injection layer 210 and the hole transport layer 250 within the above-described ranges may help provide satisfactory hole transport characteristics without a substantial increase in a driving voltage.

The hole transport area 200 may further include an electrical charge generating material (not shown) to help increase conductivity in addition to the above-mentioned materials. The electrical charge generating material may be evenly or unevenly distributed in the hole transport area 200. The electrical charge generating material may be, for example, a p-dopant. The p-dopant may be, for example, a quinine derivative, a metal oxide, or a compound containing cyano group. Examples of the p-dopant include quinon derivatives (e.g., tetracyanoquinodimethane (TCNQ) and 2,3,5,6-tetrafluoro-tetracyanoquinodimethane (F4-TCNQ)) and metal oxides (e.g., tungsten oxides, and molybdenum oxides).

As described above, the hole transport area 200 may further include at least one of a buffer layer and electron blocking layer, in addition to the hole injection layer 210 and the hole transport layer 250. The buffer layer may help compensate an optical resonance distance according to a wavelength of light emitted from a light emitting layer, and may improve light emitting efficiency. A material which may be included in the hole transport area 200 may be used as a material included in the buffer layer. The electron blocking layer is a layer which may prevent an electron injection from the electron transport area 400.

The light emitting structure 300 may be disposed on the hole transport area 200. The light emitting structure 300 may have a single layer structure formed of a single material, a single layer structure formed of a plurality of materials different from each other, or a multilayer structure including a plurality of layers formed of a plurality of materials different from each other.

According to an embodiment, the light emitting structure 300 may include a first light emitting layer 310 emitting a first color, a second light emitting layer 320 being adjacent to one side of the first light emitting layer 310 and emitting a second color, and a third light emitting layer 330 being adjacent to the other side of the first light emitting layer 310, e.g., a side of the first light emitting layer 310 opposite of the side of the first light emitting layer 310 adjacent to the second light emitting layer 320, and emitting a third color. The first to third colors may be formed of material emitting red, green, and blue colors respectively, and may include a fluorescent material or a phosphor material. In the present embodiment, for example, the first color may be a blue color, the second color may be a green color, and the third color may be a red color.

The light emitting structure 300 may be formed by using various methods, such as a vacuum deposition method, a spin coating method, a casting method, a Langmuir-Blodgett (LB) method, an inkjet printing method, a laser printing method, and laser induced thermal imaging (LITI) method.

Each of first to third light emitting layers 310, 320 and 330 of the light emitting structure 300 may include a host and a dopant.

The host may employ materials such as, for example, tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazol-2-yl)benzene (TPBi), 3-tert-butyl-9,10-di(napth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

The first light emitting layer 310 may include a fluorescent material including at least one selected from a group consisting of, for example, spiro-DPVBi, spiro-6P, distyryl-benzene (DSB), distyryl-arylene (DSA), polyfluorene (PFO) based polymer and poly(p-phenylene vinylene (PPV) based polymer. A dopant included in the first light emitting layer 310 may be selected from, for example, an organometallic complex or a metal complex such as (4,6-F2ppy)2Irpic. The first light emitting layer 310 may have a first thickness (e.g., "TK1") of about 150 Å to about 250 Å.

The second light emitting layer 320 may include a fluorescent material including, for example, tris(8-hydroxyquinolino)aluminum (Alq3). A dopant included in the second light emitting layer 320 may be selected from, for example, an organometallic complex or a metal complex such as fac-tris(2-phenylpyridine)iridium (Ir(ppy)3). The second light emitting layer 320 may have a second thickness (e.g., "TK2") of about 150 Å to about 250 Å.

The third light emitting layer 330 may include a fluorescent material including, for example, tris(dibenzoylmethanato)phenanthoroline europium (PBD:Eu(DBM)3(Phen)) or Perylene. The dopant included in the second light emitting layer 320, may be selected from, for example, an organometallic complex or a metal complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr) and octaethylporphyrin platinum (PtOEP). The third light emitting layer 330 may have a third thickness (e.g., "TK3") of about 350 Å to about 450 Å.

According to an embodiment, the light emitting structure 300 may further include a first shadow layer 340 and a second shadow layer 350 sequentially disposed on the first light emitting layer 310; a third shadow layer 360 disposed between the hole transport layer 250 and the second light emitting layer 320; a fourth shadow layer 370 disposed on the second light emitting layer 320; a fifth shadow layer 380 and a sixth shadow layer 390 sequentially disposed between the hole transport layer 250 and the third light emitting layer 330.

For example, the hole transport area 200 may be divided into three portions for convenience of description. The hole transport area 200 may include a first portion at which the first light emitting layer 310 is positioned, a second portion at which the second light emitting layer 320 is positioned, and a third portion at which the third light emitting layer 330 is positioned. The first light emitting layer 310, the first shadow layer 340, and the second shadow layer 350 may be sequentially disposed on the first portion of the hole transport area 200. A total thickness of the first and second shadow layers 340 and 350 may be about 10 Å or less. The third shadow layer 360, the second light emitting layer 320, and the fourth shadow layer 370 may be sequentially disposed on the second portion of the hole transport area 200. The fifth shadow layer 380, the sixth shadow layer 390, and the third light emitting layer 330 may be sequentially disposed on the third portion of the hole transport area 200. A total thickness of the fifth and sixth shadow layers may be about 10 Å or less. In the case that two shadow layers are sequentially stacked (for example, the first and second shadow layers or the fifth and sixth shadow layers), electric current efficiency may be decreased and a driving voltage may be increased when the total thickness of the two shadow layers may be about 10 Å or more. Accordingly, the total thickness of the two shadow layers staked in sequence may be about 10 Å or less.

Each of the first shadow layer 340 and the sixth shadow layer 390 may be formed of a substantially same material as the second light emitting layer 320, and may have a thickness corresponding to about 1% of the thickness of the second light emitting layer 320. For example, each of the first and sixth shadow layers 340 and 390 may have a thickness of about 3.5 to about 4.5 Å.

Each of the second shadow layer 350 and the fourth shadow layer 370 may be formed of a substantially same material as the third light emitting layer 330, and may have a thickness corresponding to about 1% of the thickness of the third light emitting layer 330. For example, each of the second and fourth shadow layers 350 and 370 may have a thickness of about 1.5 to about 2.5 Å.

Each of the third shadow layer 360 and the fifth shadow layer 380 may be formed of a substantially same material as the first light emitting layer 310, and may have a thickness corresponding to about 1% of the thickness of the first light emitting layer 310. For example, each of the third and fifth shadow layers 360 and 380 may have a thickness of about 1.5 to about 2.5 Å.

A service life of the light emitting device may be increased by means of the first to sixth shadow layers 340, 350, 360, 370, 380, and 390. Descriptions about this will be given through following Experimental Example.

The electron transport area 400 may be disposed on the light emitting structure 300. The electron transport area 400 may include, for example, at least one of a hole blocking layer, an electron transport layer (ETL), and an electron injection layer.

For example, the electron transport area 400 may have a multilayer structure in which an electron transport layer/an electron injection layer or a hole blocking layer/an electron transport layer/an electron injection layer are sequentially stacked from the light emitting structure 300, or may have a single layer structure in which two or more layers of the layers are mixed.

The electron transport area 400 may be formed by using various methods, such as a vacuum deposition method, a spin coating method, a casting method, an LB method, an inkjet printing method, a laser printing method, and an LITI method.

When the electron transport area 400 includes the electron transport layer, the electron transport area 400 may include, for example, lithium quinolate:lithium quinolinato (LiQ), tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), or a mixture thereof. The thickness of the electron transport layer may be about 100 to about 1000 Å, for example, about 150 to about 500 Å. Maintaining the thickness of the electron transport layer within the range described above may help provide satisfactory electron transport characteristics w without a substantial increase in a driving voltage.

When the electron transport area 400 includes the electron injection layer, the electron transport area 400 may include, for example, lanthanum group metal (e.g., LiF, lithium quinolate (LiQ), Li$_2$O, BaO, NaCl, CsF, and Yb), or halide metal (e.g., RbCl, and RbI). The electron injection layer may also be formed of a mixed material of an electron transport material and an insulating organo-metallic salt. The organo-metallic salt may be a material having an energy band gap of about 4 eV or more. For example, the organo-metallic salt may include metal acetate, metal benzoate, metal acetoacetate, metal acetylacetonate, or metal stearate. The thickness of the electron injection layer may be about 1 to about 100 Å, for example, about 3 to about 90 Å. Maintaining the thickness of the electron injection layer within the range described above may help provide satisfactory electron injection characteristics without a substantial increase in a driving voltage.

The electron transport area 400 may include the hole blocking layer as described above. The hole blocking layer may include, for example, at least one of 2,9-dimethyl-4,7-diphenyl-1,10-phenanthroline (BCP) and 4,7-diphenyl-1,10-phenanthroline (Bphen). The thickness of the electron blocking layer may be about 20 to about 1,000 Å, for example, about 30 to about 300 Å. Maintaining the thickness of the electron blocking layer within the range described above may help provide satisfactory hole blocking characteristics without a substantial increase in a driving voltage.

The second electrode 500 may be a common electrode or a cathode. The second electrode 500 may be a transmissive electrode, a transflective electrode, or a reflective electrode. When the second electrode 500 is a transmissive electrode, the second electrode 500 may be formed of Li, Ca, LiF/Ca, LiF/Al, Al, Mg, Ag, or a compound or a mixture thereof (for example, a mixture of Ag and Mg). The second electrode 500 may include an auxiliary electrode. The auxiliary electrode may include a film formed by deposition in such a way that the above-mentioned materials face a light emitting layer, and a transparent metal oxide on the film, for example, indium tin oxide (ITO), indium zinc oxide (IZO), zinc oxide (ZnO), or indium tin zinc oxide (ITZO). When the second electrode 500 is a transflective electrode or a reflective electrode, the second electrode 500 may be formed of Ag, Mg, Al, Pt, Pd, Au, Ni, Nd, Ir, Cr, Li, Ca, LiF/Ca, LiF/Al, or a compound or a mixture thereof (for example, a mixture of Ag and Mg). In an embodiment, the second electrode 500 may have a multilayer structure including a reflective film or a transflective film formed of the above-mentioned materials or a transparent conductive film formed of, for example, ITO, IZO, ZnO, or ITZO.

When the light emitting device is a top-emission type device, the first electrode 100 may be a reflective electrode, and the second electrode may be a transmissive electrode or a transflective electrode. When the light emitting device is a bottom-emission type device, the first electrode 100 may be a transmissive electrode or a transflective electrode, and the second 500 electrode may be a reflective electrode.

The following Experimental Example and Comparative Example are provided in order to highlight characteristics of one or more embodiments, but it will be understood that the Experimental Example and Comparative Example are not to be construed as limiting the scope of the embodiments, nor are the Comparative Example to be construed as being outside the scope of the embodiments. Further, it will be understood that the embodiments are not limited to the particular details described in the Experimental Example and Comparative Example.

Comparative Example

A 15 $\Omega/cm^2$ (500 Å) ITO glass substrate was used as a first electrode. The ITO glass substrate was cut to a size of about 50 mm×50 mm×0.5 mm, was ultrasonically cleaned by using isopropyl alcohol and pure water for about 10 minutes respectively, was irradiated by an ultraviolet for about 10 minutes, was exposed to ozone, and then was cleaned.

After the substrate was disposed in a vacuum deposition apparatus, 2TNATA was deposited by vacuum deposition to a thickness of about 600 Å on the glass substrate on which the first electrode was formed, and a hole injection layer 210 was formed. An electron transport material layer including an NPB (a first hole transport material layer) of about 590 Å and an LiQ of about 10 Å formed by vacuum deposition on the hole injection layer 210, then a hole transport material layer was formed in such a way that an NPB (a second hole transport material layer under the first light emitting layer) of about 100 Å, an NPB (a second hole transport material layer under the second light emitting layer) of about 700 Å, and an NPB (a second hole transport material layer under the third light emitting layer) of about 1000 Å were deposited by vacuum deposition, and a hole transport area was completely formed.

A first light emitting layer of about 200 Å was formed by vacuum deposition of a spiro-DPVBi and (4,6-F2ppy)2Irpic on a first area of the hole transport area; a second light emitting layer of about 200 Å was formed by vacuum deposition of an tris(8-hydroxyquinolino)aluminum (Alq3) and an fac-tris(2-phenylpyridine)iridium (Ir(ppy)3) on a second area of the hole transport area; a third light emitting layer of about 300 Å was formed by vacuum deposition of a tris(dibenzoylmethanato)phenanthoroline europium (PBD:Eu(DBM)3(Phen)) and bis(1-phenylisoquinoline)acetylacetonate iridium (PIQIr(acac)) on a third area of the hole transport area.

Subsequently, an electron transport layer of about 300 Å was formed by vacuum deposition of a lithium quinolate (LiQ) and tris(8-hydroxyquinolinato)aluminum (Alq3) on the first to third light emitting layers. A light emitting device was manufactured by vacuum deposition of Al 2000 Å (cathode) on the electron transport layer.

Experimental Example

A first electrode, a hole transport area, first to third light emitting layers, an electron transport layer, and a second electrode were formed on a substrate by using the manufacturing method described in the above Comparative Example.

The first light emitting layer of about 200 Å was formed on a first area of the hole transport area by vacuum deposition of spiro-DPVBi and (4,6-F2ppy)2Irpic, then each of shadow layers (third and fifth shadow layers) including the same material as the first light emitting layer was formed to have a thickness of about 2 Å on second and third areas of the hole transport area located at both sides of the first light emitting layer. The third shadow layer was formed on a second area of the hole transport area, and the fifth shadow layer was formed on a third area of the hole transport area.

The second light emitting layer of about 200 Å was formed on the second area of the hole transport area by vacuum deposition of tris(8-hydroxyquinolino)aluminum (Alq3) and fac-tris(2-phenylpyridine)iridium (Ir(ppy)3), and then shadow layers (first and sixth shadow layers) including the same material as the second light emitting layer were respectively formed to have a thickness of about 3 Å on first and third areas of the hole transport area located at both sides of the second light emitting layer. The first shadow layer was formed on the first light emitting layer, and the sixth shadow layer was formed on the fifth shadow layer.

The third light emitting layer of about 300 Å was formed on a third area of the hole transport area by vacuum deposition of tris(dibenzoylmethanato)phenanthoroline europium (PBD:Eu(DBM)3(Phen)) and bis(1-phenylisoquinoline)acetylacetonate iridium (PIQIr(acac)), and then shadow layers (second and fourth shadow layers) including the same material as the third light emitting layer were respectively formed to have a thickness of about 2 Å on first and second areas of the hole transport area located at both sides of the third light emitting layer. The second shadow layer was formed on the first shadow layer, and the fourth shadow layer was formed on the third shadow layer.

Luminance versus time in each of the first to third light emitting layers of the Experimental Example and the Comparative Example was simulated. This simulation was performed on a light emitting device of the Comparative Example and a light emitting device of the Experimental Example under luminance of 150 nit.

Figure 2:
FIG. 2 illustrates a graph of luminance versus time in a first light emitting layer of the Comparative Example and in a first light emitting layer of the Experimental Example.
Figure 3:
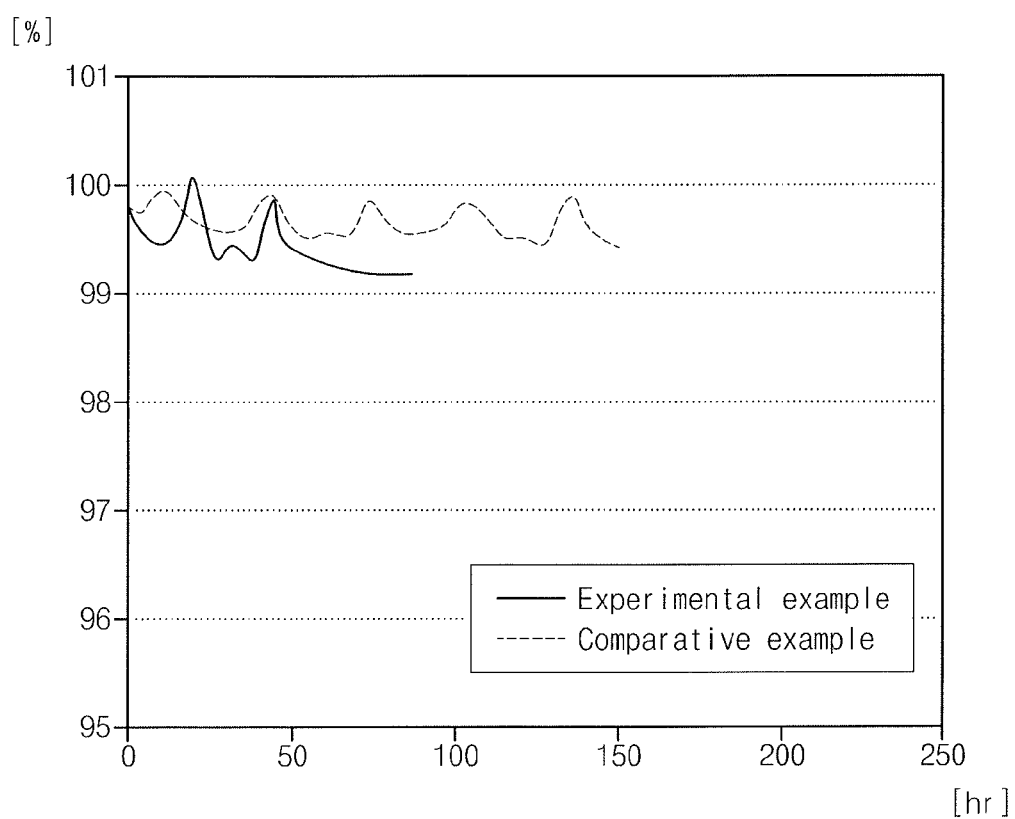
FIG. 3 illustrates a graph of luminance versus time in a second light emitting layer of the Comparative Example and in a second light emitting layer of the Experimental Example.

FIG. 2 illustrates a graph of luminance versus time in the first light emitting layer of the Comparative Example and the first light emitting layer of the Experimental Example; FIG. 3 illustrates a graph of luminance versus time in the second light emitting layer of the Comparative Example and the second light emitting layer of the Experimental Example; and FIG. 4 illustrates a graph of luminance versus time in the third light emitting layer of the Comparative Example and the third light emitting layer of the Experimental Example.

Figure 4:
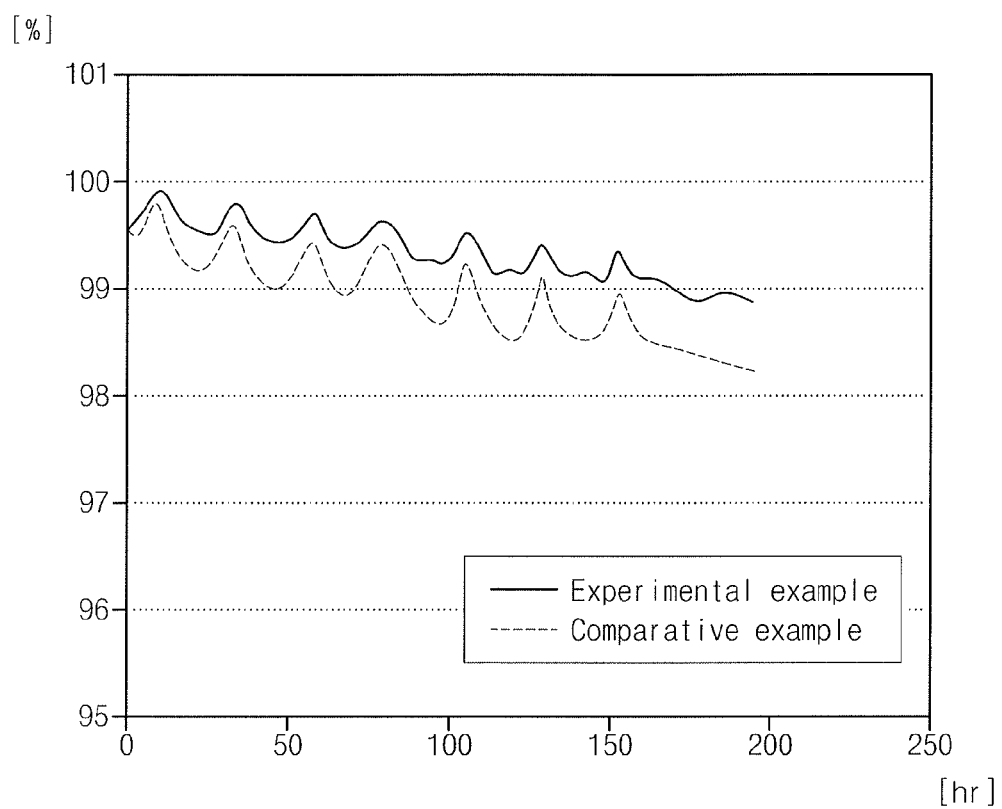
FIG. 4 illustrates a graph of luminance versus time in a third light emitting layer of the Comparative Example and in a third light emitting layer of the Experimental Example.

In the graphs of FIGS. 2 to 4, the x-axis denotes time in hours; and the y-axis denotes luminance in %.

Referring to FIG. 2, luminance of the first light emitting layer of the Comparative Example, which emits a blue color, declines exponentially as time elapses. On the other hand, the first light emitting layer of the Experimental Example, which emits a blue color light, shows a substantially same luminance as time elapses.

Referring to FIG. 3, the second light emitting layer of the Comparative Example, which emits a green color light, and the second light emitting layer of the Experimental Example show similar luminance variations over time; and referring to FIG. 4, the third light emitting layer of the Comparative Example, which emits a red color, and the third light emitting layer of the Experimental Example also show similar luminance variations over time.

As shown in FIGS. 2 to 4, when the first to sixth shadow layers are inserted between the first to third light emitting layers, luminance versus time in each of the first and third light emitting layers may be maintained or improved. For example, a light emitting device having a structure in which first and second shadow layers are inserted between the electron transport layer and the first light emitting layer which emits a blue color may have a greatly improved service life. Thus, it may be understood that deterioration of interface of the first light emitting layer and the electron transport layer may be reduced by the first and second shadow layers.

By way of summation and review, a service life of a light emitting device may be decreased by deterioration between an electron transport layer and a light emitting layer of the light emitting device.

The present disclosure provides a light emitting device, for example, a light emitting device emitting red light, green light and/or blue light, that may have an extended service life without a decrease in power efficiency.

According to embodiments, a shadow layer may be inserted between a light emitting layer and an electron transport layer, and a service life of the light emitting device may be increased without a decrease in power efficiency of the light emitting device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device, comprising:
a first electrode;
a hole transport area on the first electrode;
a first light emitting layer on the hole transport area, the first light emitting layer emitting a first color, and having a first thickness;
a second light emitting layer adjacent to one side of the first light emitting layer, the second light emitting layer emitting a second color, and having a second thickness;
a first shadow layer on the first light emitting layer, the first shadow layer having a thickness corresponding to about 1% of the second thickness;
an electron transport area on the first light emitting layer, the second light emitting layer, and the first shadow layer; and
a second electrode on the electron transport area,
wherein the first light emitting layer includes a first host material and a first dopant material, and the second light emitting layer includes a second host material and a second dopant material, and
wherein the first shadow layer includes the second host material and the second dopant material.

2. The device as claimed in claim 1, further comprising a second shadow layer between the hole transport area and the second light emitting layer, the second shadow layer including a same material as the first light emitting layer, and having a thickness corresponding to about 1% of the first thickness.

3. The device as claimed in claim 1, wherein the first and second colors are selected from blue, green, and red.

4. The device as claimed in claim 1, wherein the first color is blue, and the second color is green.

5. The device as claimed in claim 1,
wherein the hole transport area includes a hole transport layer, the hole transport layer including:
a first hole transport material layer adjacent to the first electrode;
a second hole transport material layer adjacent to the first and second light emitting layers; and
an electron transport material layer between the first and second hole transport material layers, and the electron transport material layer including a same material as the electron transport area.

6. The device as claimed in claim 5, wherein the electron transport material layer includes lithium quinolate (LiQ).

7. A light emitting device, comprising:
a first electrode;
a hole transport area on the first electrode;
a first light emitting layer on the hole transport area, the first light emitting layer emitting a first color, and having a first thickness;
a second light emitting layer adjacent to one side of the first light emitting layer, the second light emitting layer emitting a second color, and having a second thickness;
a first shadow layer on the first light emitting layer, the first shadow layer including a same material as the second light emitting layer, and the first shadow layer having a thickness corresponding to about 1% of the second thickness;
an electron transport area on the first light emitting layer, the second light emitting layer, and the first shadow layer;
a second electrode on the electron transport area;
a third light emitting layer adjacent to a side of the first light emitting layer opposite of the side of the first light emitting layer adjacent to the second light emitting layer, the third light emitting layer emitting a third color, and the third light emitting layer having a third thickness; and
a second shadow layer on the first shadow layer and the second light emitting layer, and the second shadow layer having a thickness corresponding to about 1% of the third thickness.

8. The device as claimed in claim 7, wherein a total thickness of the first and second shadow layers is about 10 Å or less.

9. The device as claimed in claim 7, further comprising:
a third shadow layer between the hole transport area and the third light emitting layer, the third shadow layer including a same material as the first light emitting layer, and the third shadow layer having a thickness corresponding to about 1% of the first thickness; and
a fourth shadow layer between the third shadow layer and the third light emitting layer, the fourth shadow layer including the same material as the second light emitting layer, and the fourth shadow layer having a thickness corresponding to about 1% of the second thickness.

10. The device as claimed in claim 9, wherein a total thickness of the third and fourth shadow layers is about 10 Å or less.

11. The device as claimed in claim 9, further comprising a fifth shadow layer between the hole transport area and the second light emitting layer, the fifth shadow layer including the same material as the first light emitting layer, the fifth shadow layer and having a thickness corresponding to about 1% of the first thickness.

12. The device as claimed in claim 7, wherein the first, second, and third colors are selected from blue, green, and red.

13. The device as claimed in claim 7, wherein the first color is blue, the second color is green, and the third color is red.

14. A light emitting device comprising:
- a first electrode;
- a hole transport area on the first electrode;
- a first light emitting layer on the hole transport area, the first light emitting layer emitting a first color, and having a first thickness;
- a second light emitting layer adjacent to one side of the first light emitting layer, the second light emitting layer emitting a second color, and having a second thickness;
- a third light emitting layer adjacent to a side of the second light emitting layer, the third light emitting layer emitting a third color, and having a third thickness;
- a first shadow layer on the first light emitting layer, the first shadow layer including a same material as the second light emitting layer;
- a second shadow layer on the first shadow layer and the second light emitting layer, the second shadow layer including a same material as the third light emitting layer;
- an electron transport area on the first light emitting layer, the second light emitting layer, and the third light emitting layer; and
- a second electrode on the electron transport area.

15. The device as claimed in claim 14, wherein the first shadow layer has a thickness corresponding to about 1% of the second thickness.

16. The device as claimed in claim 14, wherein the second shadow layer has a thickness corresponding to about 1% of the third thickness.

17. The device as claimed in claim 14, further comprising:
- a third shadow layer between the hole transport area and the third light emitting layer, the third shadow layer including a same material as the first light emitting layer; and
- a fourth shadow layer between the third shadow layer and the third light emitting layer, the fourth shadow layer including the same material as the second light emitting layer.

18. The device as claimed in claim 17, further comprising a fifth shadow layer between the hole transport area and the second light emitting layer, the fifth shadow layer including the same material as the first light emitting layer.

19. The device as claimed in claim 14, wherein the first color is blue, the second color is green, and the third color is red.

20. The device as claimed in claim 14, wherein the hole transport area includes a hole transport layer, the hole transport layer including:
- a first hole transport material layer adjacent to the first electrode;
- a second hole transport material layer adjacent to the first light emitting layers; and
- an electron transport material layer between the first hole transport material layer and the second hole transport material layers, and the electron transport material layer including a same material as the electron transport area.

* * * * *